US00RE35821E

United States Patent [19]

Niki et al.

[11] E Patent Number: Re. 35,821

[45] Reissued Date of Patent: Jun. 9, 1998

[54] PATTERN FORMING METHOD INCLUDING THE FORMATION OF AN ACIDIC COATING LAYER ON THE RADIATION-SENSITIVE LAYER

[75] Inventors: Hirokazu Niki, Yokohama; Rumiko Hayase, Kawasaki; Naohiko Oyasato, Kawaguchi; Yasunobu Onishi, Yokohama; Akitoshi Kumagae, Yachiyo; Kazuo Sato, Yokohama; Masataka Miyamura, Kamakura; Yoshihito Kobayashi, Kawasaki, all of Japan

[73] Assignee: Kabushiki Kaisha Toshiba, Kawasaki, Japan

[21] Appl. No.: 639,973

[22] Filed: Apr. 29, 1996

Related U.S. Patent Documents

Reissue of:

[64] Patent No.: 5,326,675
Issued: Jul. 5, 1994
Appl. No.: 987,821
Filed: Dec. 9, 1992

[30] Foreign Application Priority Data

Dec. 9, 1991 [JP] Japan ..... 3-324162
Sep. 14, 1992 [JP] Japan ..... 4-244714

[51] Int. Cl.[6] ..... G03C 5/00

[52] U.S. Cl. ..... 430/326; 430/330; 430/324; 430/327; 430/273.1

[58] Field of Search ..... 430/326, 330, 430/324, 327, 273.1

[56] References Cited

U.S. PATENT DOCUMENTS 5,198,326 3/1993 Hashimoto et al. .

FOREIGN PATENT DOCUMENTS 63-287950 11/1988 Japan .
4-204848 7/1992 Japan .

*Primary Examiner*—Geraldine Letscher
*Attorney, Agent, or Firm*—Oblon, Spivak, McClelland, Maier & Neustadt, P.C.

[57] ABSTRACT

A radiation-sensitive layer comprising as a main component a radiation-sensitive composition containing a compound capable of generating an acid when exposed to a chemical radiation and a compound having at least one linkage decomposable by an acid is formed on a substrate. An acidic coating layer is formed on the radiation-sensitive layer. The radiation-sensitive layer and the acidic coating layer are pattern-exposed to a chemical radiation. The radiation-sensitive layer and the acidic coating layer are baked and developed by using an aqueous alkaline solution to obtain a pattern comprising lines and spaces, each having a predetermined width. A fine pattern of a rectangular sectional shape can be formed without producing eaves caused by a surface inhibition layer layer, which is produced on the film surface.

6 Claims, No Drawings

PATTERN FORMING METHOD INCLUDING THE FORMATION OF AN ACIDIC COATING LAYER ON THE RADIATION-SENSITIVE LAYER

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a pattern forming method and, more particularly, to a method of forming a resist pattern applied to micropatterning in fabricating electronic components such as large-scale semiconductor integrated circuits (LSIs).

2. Description of the Related Art

In the fabrication of various electronic components including semiconductor integrated circuits, micropatterning techniques using photolithography are adopted. In practice, such techniques are carried out by the following process. First, a photoresist film is formed on a semiconductor substrate by means of, e.g., a spin coating method. After the resist film is patternexposed, development and rinsing are performed to form a desired resist pattern. Subsequently, this resist pattern is used as an anti-etching mask to etch the substrate, thereby forming fine lines or opening portions. Especially in recent years, to increase the degree of integration along with an increase in packaging density of electronic components, it is required that very fine resist patterns on a submicron order be formed in the above process.

As an exposure apparatus for forming the resist pattern, a reduction-projecting mask aligner of a stepand-repeat type, generally called a stepper, is used. Examples of a radiation source for use in this stepper are g-line (wavelength 436 nm), h-line (wavelength 405 nm), and i-line (wavelength 365 nm) of mercury lamps, and excimer lasers, such as XeF (wavelength 351 nm), XeCl (wavelength 308 nm), KrF (wavelength 248 nm), KrCl (wavelength 222 nm), ArF (wavelength 193 nm), and $F_2$ (wavelength 157 nm). To form fine patterns, the wavelength of a radiation source used is preferably as short as possible. In particular, deep Uv of an excimer laser or the like is preferable. It is also possible to form finer patterns by using electron beam or X-ray with a shorter wavelength.

Since, however, a conventional resist has a large absorption for deep UV, such radiation cannot satisfactorily reach a position deep in a resist film. That is, a chemical change occurring upon exposure to deep UV cannot progress sufficiently in a region deep from the surface of a resist film. Consequently, the sectional shape of a resist pattern formed becomes a triangle, for a positive resist, or an inverted triangle, for a negative resist. This significantly degrades the function of the resist pattern as an anti-etching mask.

To solve this problem, the use of a resist called a chemical amplification-type resist has been proposed. The chemical amplification-type resist is, for example, a photosensitive composition containing a compound which generates an acid when exposed to light, i.e., a photo-acid generator, and a compound, the hydrophobic group of which is decomposed by the generated acid, and which therefore changes into a hydrophilic compound. Practical examples are a positive resist containing a polymer, in which a hydroxyl group of poly(p-hydroxystyrene) is blocked by butoxycarbonyl group, and an onium salt as the photo-acid generator, disclosed in H. Ito, C. G. Wilson, and J. M. J. Frechet, U.S. Pat. No. 4,491,628 (1985); and a positive resist containing a m-cresol novolak resin, nathphalene-2-carboxylic acid-tert-butyl ester, and, as the photo-acid generator, triphenylsulfonium salt, described in M. J. O'Brien, J. V. Crivello, SPIE Vol. 920, Advances in Resist Technology and Processing, p. 42, (1988). In addition, a positive resist containing 2,2-bis (4-tert-butoxycarbonyloxyphenyl)propane or polyphthalaldehyde, and an onium salt as the photo-acid generator, is described in H. Ito, SPIE Vol. 920, Advances in Resist Technology and Processing, p. 33, (1988).

In these chemical amplification-type resists, the acid generated by the photo acid-generator functions as a catalyst. Hence, only a small amount of the acid can efficiently induce a chemical change inside the resist. As a result, when the resist film is exposed to a radiation, the reaction can sufficiently proceed even in a portion inside the film which the radiation is difficult to reach compared to the film surface. This makes it possible to form a resist pattern with steep side surfaces in line portions upon development.

The chemical amplification-type resist described above, however, has a high sensitivity and is therefore readily influenced by oxygen, moisture, and other minor contaminations in a process atmosphere. As an example, S. A. MacDonald et al., SPIE Vol. 1,466, Advances in Resist Technology and Processing, p. 2, (1991) reports that a trace amount of dimethyaniline contained in an atmosphere deactivates an acid generated in the vicinity of the surface of a chemical amplification-type resist film when exposed to light to produce a surface inhibition layer, i.e., a layer with a significantly low dissolving rate into a developing solution on the surface of the resist film, and this surface inhibition layer remains like eaves on the surface of a resist pattern after exposure and development. The surface inhibition layer decreases the resolution of the resist, and the eaves produced on the resist pattern by that layer adversely affect the etching accuracy in a region of a semiconductor substrate.

various methods have been proposed in order to solve the above problems.

For example, a method of improving the photo-acid generator contained in the chemical amplification-type resist to increase the concentration of an acid to be generated has been attempted. In this method, however, if the generated acid is a strong acid, it is difficult to control the acid. If the generated acid is a weak acid, the strength of the acid is insufficient although its concentration is high. In either case, the result is a reduction in resolution of a resultant pattern. There is another attempt to add a basic compound, as an additive, to the resist, thereby relatively relaxing the influence of basic substances in an atmosphere on the resist film, or to add an acidic compound to neutralize the basic substances from an atmosphere. However, the effect of either method is still unsatisfactory.

In addition, a method of forming a protective film on a film of the chemical amplification-type resist to shield the film surface from an atmosphere has been proposed. For instance, Published Unexamined Japanese Patent Application No. 63-287950 describes a method of stacking a neutral polymer, such as polyvinyl alcohol or polyvinyl pyrrolidone, as a protective film on a chemical amplification-type printing plate to prolong the storage life of the printing plate. However, although polyvinyl alcohol or polyvinyl pyrrolidone as the material of the protective film has a barrier effect against oxygen or moisture, it cannot always effectively prevent the formation of the surface inhibition layer described above.

SUMMARY OF THE INVENTION

The present invention has been made in consideration of the above conventional problems and has as its object to provide a pattern forming method applicable to photolithography in a fabrication process of semiconductor devices and the like and using a chemical amplification-type resist sensitive to a chemical radiation with a short wavelength, such as ultraviolet rays or an ionizing radiation, which can stably form a fine pattern with a rectangular section without producing eaves caused by a surface inhibition layer, i.e., marks of the surface inhibition layer.

The above object of the present invention is achieved by the pattern forming methods according to first or second embodiment described below.

The pattern forming method according to a first embodiment of the present invention is characterized by comprising the steps of:

forming, on a substrate, a radiation-sensitive layer comprising as a main component a radiationsensitive composition containing a compound capable of generating an acid when exposed to a chemical radiation and a compound having at least one linkage decomposable by an acid;

forming an acidic coating layer on the radiationsensitive layer;

pattern-exposing the radiation-sensitive layer and the acidic coating layer to a chemical radiation; and developing the radiation-sensitive layer and the coating layer after exposure.

The pattern forming method according to a second embodiment of the present invention is characterized by comprising the steps of:

forming, on a substrate, a radiation-sensitive layer comprising as a main component a radiationsensitive composition containing a compound capable of generating an acid when exposed to a chemical radiation and a compound having at least one linkage decomposable by an acid;

forming a coating layer on the radiation-sensitive layer by coating a solution prepared by dissolving a polymer in an organic solvent which does not essentially dissolve the radiation-sensitive layer;

pattern-exposing the radiation-sensitive layer and the coating layer to a chemical radiation;

dissolving away the coating layer by an organic acid which does not essentially dissolve the radiationsensitive layer; and developing the exposed radiation-sensitive layer.

In the present invention, the term "radiation-sensitive" means to have sensitivity to microwaves, infrared rays, visible light, ultraviolet rays, high-energy radiations, such as X-ray, electron beam, and other particle radiations, which are generally called electromagnetic waves. In addition, "chemical radiation" is a general term for radiations capable of chemically changing radiation-sensitive substances.

According to any of pattern forming methods of the present invention, a radiation-sensitive layer is formed on a substrate, a predetermined coating layer is formed on the radiation-sensitive layer, and pattern exposure is performed by using a chemical radiation, such as ultraviolet ray, to allow a photo-acid generator in the radiation-sensitive layer to generate an acid. This acid reacts with and decomposes a compound having at least one linkage decomposable by an acid in the radiation-sensitive layer. After the pattern exposure, baking is performed at a predetermined temperature if necessary, so that the reaction proceeds not only in the surface side of the radiation-sensitive layer but also in the direction of depth of the layer, i.e., toward the surface of the substrate. In the process to this point, the coating layer formed on the radiation-sensitive layer shields harmful components in an atmosphere, which inhibit the reaction. As a result, it is possible to prevent formation of a surface inhibition layer, i.e., a layer with a significantly low dissolving rate into a developing solution on the surface of the radiationsensitive layer, which has been a problem in conventional chemical amplification-type resists. Subsequently, when the coating layer is removed upon development, a fine pattern with a rectangular sectional shape can be obtained.

In the method according to the first embodiment, in particular, the coating layer is an an acidic layer. Hence, a basic compound, such as an amine, which is considered to be a cause of formation of the surface inhibition layer on the surface of the radiation-sensitive layer is neutralized. This allows formation of a fine pattern with a rectangular section free from eaves on its surface.

In the method according to the second embodiment, on the other hand, since the coating layer is a layer comprising, e.g., a neutral polymer, a surface inhibition layer slightly forms on the surface of the radiation-sensitive layer. This surface inhibition layer, however, can be removed at the same time the coating layer is dissolved away by using a predetermined organic solvent after pattern exposure and baking. This leads to prevention of production of eaves caused by the surface inhibition layer in a pattern formed after development.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

DETAILED DESCRIPTION OF THE PREFERRED EMBODIMENTS

The pattern forming method according to the first embodiment of the present invention will be described in detail below in an order of steps.

As the first step, a radiation-sensitive composition containing a compound capable of generating an acid when exposed to a chemical radiation and a compound having at least one linkage decomposable by an acid is coated on a substrate by, e.g., a spin coating method or a dipping method and dried at a temperature of 150° C. or less, preferably 70° to 120° C. to form a radiation-sensitive layer (resist film) containing the above composition as a main component.

Examples of the substrate are a silicon wafer, a silicon wafer with steps, on the surface of which various insulating films, electrodes, and interconnections are formed, a blank mask, and a III-V compound semiconductor wafer comprising, e.g., GaAs or AlGaAs.

The radiation-sensitive composition, on the other hand, corresponds to a so-called positive chemical amplification-type resist.

The compound capable of generating an acid when exposed to a chemical radiation, as the first component of the composition, i.e., a photo-acid generator is not particularly limited, but various known compounds and mixtures can be used. Examples are an onium salt, an organic halogen compound, orthoquinone-diazidosulfonic chloride, and sulfonates.

Examples of the onium salt are diazonium salts, phosphonium salts, sulfonium salts, and iodonium salts, each having $CF_3SO_3$—, p—$CH_3PhSO_3$—, or p—$NO_2PhSO_3$-, for example, as a counter anion.

The organic halogen compound is a compound for forming a hydrohalogenic acid. Examples are those disclosed in U.S. Pat. Nos. 3,515,552, 3,536,489, and 3,779,778, and German Offenlegungsschrtft No. 2,243,621.

Examples of the photo-acid generator other than those enumerated above are compounds disclosed in Published Unexamined Japanese Patent Application Nos. 54-74728, 55-24113, 55-77742, 60-3626, 60-138539, 56-17345, and 50-36209.

More specifically, examples of these compounds are di(p-tert-butylbenzene)diphenyliodonium trifluoromethanesulfonate, benzointosylate, o-nitrobenzyl p-toluenesulfonate, triphenylsulfonium trifluoromethanesulfonate, tri(t-butylphenyl)sulfonium trifluoromethanesulfonate, benzenediazonium p-toluenesulfonate, 4-(din-propylamino)-benzonium tetrafluoroborate, 4-p-tolyl-mercapto-2,5-diethoxy-benzenediazonium hexafluorophosphate, tetrafluoroborate, diphenylamine-4-diazonium sulfate, 4-methyl-6-trichloromethyl-2-pyrone, 4-(3,4,5-trimethoxy-styryl)-6-trichloromethyl-2-pyrone, 4-(4-methoxy-styryl)-6-(3,3,3-trichloro-propenyl)-2-pyr one, 2-trichloromethyl-benzimidazole, 2-tribromomethyl-quinolone, 2,4-dimethyl-1-tribromoacetyl-benzene, 4-dibromoacetyl-benzoic acid, 1,4-bis-dibromomethyl-benzene, tris-dibromomethyl-S-triazine, 2-(6-methoxy-naphthyl-2-yl)-4,6-bis-trichloromethyl-S-triazine, 2-(naphthyl-1-yl)-4,6-bis-trichloromethyl-S-triazine, 2-(naphthyl-2-yl)-4,6-bis-trichloromethyl-S-triazine, 2-(4-ethoxyethyl-naphthyl-1-yl)-4,6-bis-trichloromethylS-triazine, 2-(benzopyran-3-yl)-4,6-bis-trichloromethyl-S-triazine, 2-(4-methoxy-anthracene-1-yl)-4,6-bis-trichloromethyl-S-triazine, 2-(phenanthyl-9-yl)-4,6-bis-trichloromethyl-S-triazine, and o-naphthoquinonediazido-4-sulfonic chloride.

Examples of the sulfonate are naphthoquinonediazido-4-sulfonate, naphthoquinonediazido-5-sulfonate, p-toluenesulfonic acid-o-nitrobenzyl ester, and p-toluenesulfonic acid-2,6-dinitrobenzyl ester.

The compound having at least one linkage decomposable by an acid, as the second component of the radiation-sensitive composition, is not particularly limited provided that the compound is decomposed by an acid to change its solubility in a developing solution. An example is an ester or ether based on a phenolic compound. More specifically, this ester or ether is a compound obtained by esterifying or etherifying a hydroxyl group (phenolic hydroxyl group) in a phenolic compound by using an appropriate compound (esterifying or etherifying agent), i.e., by introducing an ester or ether linkage into the hydroxyl group, thereby suppressing its alkali affinity. This ester or ether is insoluble in an alkali solution when it is unexposed. When exposed, however, this ester or ether is decomposed by an acid generated by the photo-acid generator, as the first component, to change into an alkali-soluble compound. When, therefore, the radiation-sensitive composition contains this ester or ether as its second component, development using an alkali solution is possible.

Examples of the phenolic compound as the base for the ester or ether are phenol, cresol, xylenol, bisphenol A, bisphenol S, hydroxybenzophenone, 3,3,3',3'-tetramethyl-1,1'-spiroindane-5,6,7,5',6',7'-hexanol, phenolphthalein, polyvinyl phenol, and a novolak resin.

Examples of the ester and ether to be introduced into the phenolic compound are methyl ester, ethyl ester, n-propyl ester, iso-propyl ester, tert-butyl ester, n-butyl ester, iso-butyl ester, benzyl ester, tetrahydropyranyl ether, benzyl ether, methyl ether, ethyl ether, n-propyl ether, iso-propyl ether, tertbutyl ether, allyl ether, methoxymethyl ether, p-bromophenacyl ether, trimethylsilyl ether, benzyloxycarbonyl ether, tert-butoxycarbonyl ether, tert-butylacetate, and 4-tert-butylbenzyl ether.

The radiation-sensitive composition may contain an alkali-soluble polymer, as its third component, in addition to the first and second components described above. Mixing a proper amount of such an alkali-soluble polymer makes it possible to control the dissolving rate of the radiation-sensitive layer (radiation-sensitive composition) in an alkaline solution. Consequently, the resolution of a formed pattern can be further improved especially when an alkaline developing solution is used in the subsequent development.

The alkali-soluble polymer is preferably a resin having an aryl group, to which a hydroxyl group or a carboxy group is introduced. Practical examples of the alkali-soluble polymer; are a phenolic novolak resin; a cresol novolak resin; a xylesol novolak resin; a vinylphenol resin; an isopropenylphenol resin; a copolymer of vinylphenol and at least one component selected from the group consisting of acrylic acid, a methacrylic acid derivative, acrylonitrile, and a styrene derivative; a copolymer of isopropenylphenol and at least one component selected from the group consisting of acrylic acid, a methacrylic acid derivative, acrylonitrile, and a styrene derivative; a copolymer of a styrene derivative and at least one component selected from the group consisting of acrylic acid, methacrylic acid, maleic acid, maleic anhydride, and acrylonitrile; and compounds containing silicon in the structures of these polymers. It is also possible to use a resin with transparency improved by reducing quinone produced by oxidizing part of the phenolic resin described above.

In addition to the above first, second, and third components, the radiation-sensitive composition may further contain a surfactant as a film-modifying agent or a dye as a reflection inhibitor.

In the radiation-sensitive composition, the mixing amount of the photo-acid generator, as the first component, is preferably about 0.1 to 30 wt %, and more preferably 0.5 to 20 wt % based on the weight of the solid components in the composition. If the mixing amount of the photo acid-generator is lea than 0.1 wt %, there is a possibility that no satisfactory photosensitive characteristics are imparted to the radiation-sensitive layer. If the amount exceeds 30 wt %, on the other hand, it may become difficult to form a uniform radiation-sensitive layer, or a residue may remain on the surface of a substrate when the radiation-sensitive layer is removed after pattern formation and etching.

When the radiation-sensitive composition is mixed with the alkali-soluble polymer as its third component, the mixing amount of the polymer is preferably about 90 parts by weight or less, and more preferably 80 parts by weight or less with respect to the total of 100 parts by weight of the compound having at least one linkage decomposable by an acid, as the second component, and the alkali-soluble polymer. If the mixing amount of the alkali-soluble polymer exceeds 90 parts by weight, the difference in dissolving rate in a developing solution between exposed and unexposed portions of the radiationsensitive layer may be decreased to decrease the resolution of a pattern to be formed.

The radiation-sensitive composition used in the first step is prepared by dissolving the first component, the second component, the alkali-soluble polymer as the third component to be mixed as needed, and other additives in an appropriate organic solvent and filtering the resultant solution. Examples of the organic solvent are a ketone-based solvent, such as cyclohexanone, acetone, methyl ethyl ketone, and methyl isobutyl ketone; a cellosolve-based solvent, such as methyl cellosolve, methyl cellosolve acetate, ethyl cellosolve, ethyl cellosolve acetate, butyl cellosolve, and butyl cellosolve acetate; an ester-based solvent, such as ethyl acetate, butyl acetate, isoamyl acetate, ethyl lactate, and methyl lactate; an alcohol-based solvent, such as 2-butanol, isoamyl alcohol, and diethylene glycol; a polyvalent alcohol derivative-based solvent, such as ethylene glycol diethyl ether, diethylene glycol monoethyl ether, and ethyl carbitol; morpholine; and N-methyl-2-pyrrolidone. These solvents may be used singly or in the form of a mixture.

As the second step subsequent to the above first step, an acidic coating layer is formed on the radiation-sensitive layer.

This acidic coating layer is an acidic layer which does not essentially absorb a chemical radiation. Preferable examples of the constituent components of this layer are (a) an acidic water-soluble polymer, (b) an organic acid and a water-soluble polymer, and (c) an organic acid and an acidic water-soluble polymer. In particular, an acidic coating layer mainly comprising the composition (c) protects the underlying radiation-sensitive layer against harmful constituents in an atmosphere over long periods of time. Hence, it is possible to effectively suppress the formation of a surface inhibition layer on the surface of the radiation-sensitive layer.

More specifically, the second step is performed according to the process described below. First, an aqueous polymer solution, prepared by dissolving any of an acidic water-soluble polymer, a combination of an organic acid and a water-soluble polymer, and a combination of an organic acid and an acidic water-soluble polymer, in pure water is coated on a substrate by means of, e.g., a spin coating method or a dipping method. Subsequently, the resultant layer of the solution is dried at a temperature of about 150° C. or lower, preferably 120° C. or lower to form an cidic coating layer comprising as a main component the composition (a), (b), or (c) described above. In this step, since the layer formation is performed using an aqueous solution, the surface of the radiation-sensitive layer containing an organic substance such as the chemical amplification-type resist, as its main component, is not dissolved nor swell.

preferable examples of the acidic water-soluble polymer for forming the coating layer comprising the composition (a) or (c) are a polymer having a carboxy group or a sulfo group as a substituent, and a copolymer containing a monomer unit having a carboxy group or a sulfo group as a substituent. Practical examples of these polymer are polyacrylic acid, polymethacrylic acid, polystyrenesulfonic acid, polymaleic acid, polyitaconic acid, an itaconic acid-acrylic acid copolymer, an itaconic acid-methacrylic acid copolymer, in ethylene-maleic anhydride copolymer, an ethylenemethacrylic acid copolymer, a methyl vinyl ether-maleic anhydride copolymer, a styrene-maleic anhydride copolymer, an isobutylene-maleic anhydride copolymer, and copolymers obtained by partially esterifying the above copolymers containing maleic anhydride as a constituent unit by reacting them with an alcohol. Examples of the alcohol used in the partial esterification are methyl alcohol, ethyl alcohol, n-propyl alcohol, and isopropyl alcohol. These acidic water-soluble polymers can be used singly or in the form of a mixture of two or more types of them. Note that, of the acidic water-soluble polymers exemplified above, each copolymer containing maleic anhydride becomes acidic when dissolved in pure water in the process of forming the coating layer because an anhydrous bond in maleic anhydride cleaves into carboxylic acid.

The organic acid for forming the coating layer comprising the composition (b) or (c) is preferably a compound having a carboxy group, a sulfo group, or a hydroxyl group as a substituent. Practical examples of the compounds are acetic acid, propionic acid, butyric acid, methacrylic acid, sorbic acid, oxalic acid, succinic acid, maleic acid, 2-hydroxybutyric acid, malic acid, sulfoacetic acid, isethionic acid, cyclohexanedicarboxylic acid, hexahydrocarboxylic acid, phenol, resorcin, pyrogallol, phthalic acid, pyromellitic acid, salicylic acid, resorcylic acid, sulfobenzoic acid, 5-sulfosalicylic acid, benzenesulfonic acid, toluenesulfonic acid, benzenedisulfonic acid, phenol-2,4-disulfonic acid, and naphthalenesulfonic acid. These organic acids can be used singly or in the form of a mixture of two or more types of them.

Practical examples of the water-soluble polymer for forming a coating layer comprising the composition (b) are polyvinyl alcohol, polyvinyl pyrrolidone, polyacrylamide, polyethyleneoxide, pullulan, dextran, methyl cellulose, hydroxymethyl cellulose, hydroxypropyl cellulose, a partially saponified product of polyvinyl acetate, a copolymer of vinyl pyrrolidone and vinyl alcohol, a copolymer of styrene and ethyleneoxide, a copolymer of ethylene and vinyl alcohol, polyvinyl methyl ether, and a carboxyvinyl polymer. These watersoluble polymers can be used singly or in the form of a mixture of two or more types of them.

The acidic coating layer may contain a surfactant as a film-modifying agent where necessary. Such a surfactant is preferably a nonionic surfactant. Practical examples are polyoxyethylene alkyl phenyl ether, polyoxyethylene alkyl ether, polyoxyethylene fatty ester, polyoxyethylene sorbitan fatty ester, a polyoxyethylenepolyoxypropylene block polymer, sorbitan fatty ester, fatty acid alkylolamide, polyoxyethylene lanolin alcohol ether, and polyoxyethylene lanolin fatty ester. A coating layer containing any of these surfactants is preferable in that precipitation of polymers in the subsequent step is prevented.

The thickness of the acidic coating layer is preferably about 10 to 1,000 nm, and more preferably 50 to 500 nm. If the thickness of the coating layer is less than 10 nm, it may become difficult to sufficiently achieve the effect of preventing formation of the inhibition surface layer on the surface of the radiation-sensitive layer. If the thickness of the radiation-sensitive layer exceeds 1,000 nm, on the other hand, the resolution of a formed pattern may be decreased. Note that the thickness of the acidic coating layer does not depend on the thickness of the underlying radiation-sensitive layer but is arbitrarily determined by taking into account the thickness of a inhibition surface layer to be formed on the surface of the radiation-sensitive layer.

As the third step subsequent to the second step, the radiation-sensitive layer and the acidic coating layer stacked on it are pattern-exposed to a chemical radiation.

As the chemical radiation, an optimal radiation can be selected in accordance with the properties of the photo-acid generator as the first component of the radiation-sensitive composition. Examples are various ultraviolet rays, such as i-line, h-line, and g-line of a mercury lamp and KrF excimer laser, and ArF excimer laser, or X-ray, electron beam, and ion beam.

More specifically, the third step is performed by, when ultraviolet rays, such as i-line, h-line, or g-line of a mercury lamp, KrF excimer laser, ArF excimer laser, or X-ray are used, pattern-exposing the radiation-sensitive layer and the acidic coating layer through a mask having a desired pattern. When electron beam or ion beam is used, on the other hand, the pattern exposure is performed directly on the radiation-sensitive layer and the coating layer by scanning the radiation without using a mask.

In this third step, the photo-acid generator as the first component generates an acid in the portion (exposed portion) exposed to the chemical radiation in the radiation-sensitive layer (composition), and this acid reacts with and decomposes the compound, as the second component, which has at least one linkage decomposable by an acid.

If necessary, it is also possible to bake after the pattern exposure the radiation-sensitive layer and the coating layer at a temperature of generally about 70° to 160° C., preferably 80° to 150° C. to accelerate the amplification reaction. That is, the baking allows diffusion of the acid generated in the portion of the radiation-sensitive layer exposed to the chemical radiation, and this accelerates the reaction between the acid and the second component. The temperature in this baking process is limited as described above because, if the temperature is lower than 70° C., it may become difficult to satisfactorily accelerate the above reaction. If the temperature exceeds 160° C., the exposed and unexposed portions of the radiation-sensitive layer may be decomposed or cured.

As the fourth step subsequent to the third step, the acidic coating layer and the radiation-sensitive layer after the exposure or the baking are developed by using a predetermined developing solution. In addition, after the developing solution is washed away with pure water, the substrate is dried.

In this fourth step (development), an aqueous alkaline solution is preferably used as the developing solution in consideration of the components constituting the radiation-sensitive layer. In this case, the acidic coating layer is removed through the exposed and unexposed portions. In addition, one of the exposed and unexposed portions, generally the exposed portion of the radiation-sensitive layer underlying the coating layer is selectively dissolved away into the developing solution to form a predetermined pattern. Even if a surface inhibition layer slightly forms on the radiation-sensitive layer, this surface inhibition layer can also be dissolved together with the acidic coating layer. As described above, the method of the present invention can adopt development using an aqueous alkaline solution, and this suppresses swelling of the formed pattern compared to development using, e.g., an organic solvent.

In the fourth step, the acidic coating layer may be removed by treating it with pure water or the like, so as to subsequently treat the exposed radiation-sensitive layer with a developing solution such as an aqueous alkaline solution. This removal of the acidic coating layer prior to the treatment by a developing solution, i.e., the development, can prevent changes in alkali concentration of an aqueous alkaline solution as a developing solution caused by the influence of an acidic component of the coating layer, e.g., the influence of an acidic water-soluble polymer or an organic acid. This makes it possible to stably form a pattern with high resolution.

Examples of the aqueous alkaline solution usable as the developing solution are aqueous inorganic alkaline solutions of, e.g., potassium hydroxide, sodium hydroxide, sodium carbonate, sodium silicate, and sodium metasilicate, and aqueous organic alkaline solutions, such as an aqueous solution of tetramethylammoniumhydroxide and an aqueous solution of trimethylhydroxyethylammoniumhydroxide. Alternatively, aqueous solutions prepared by adding alcohols, surfactants, and the like to these developing solutions can also be used.

The pattern forming method according to the second embodiment of the present invention will be described in detail below.

The pattern forming method according to the second embodiment of the present invention is similar to the method according to the first embodiment in formation of a radiation-sensitive layer comprising a chemical amplification-type resin, pattern exposure to a chemical radiation, and development. The method according to the second embodiment is characterized by components constituting a coating layer formed on the radiation-sensitive layer and a step of removing the coating layer before development.

In the pattern forming method, a polymer is dissolved in an organic solvent which does not essentially dissolve the radiation-sensitive composition, and the obtained polymer solution is coated on a radiationsensitive layer and dried to form a neutral coating layer.

Examples of the polymer are rubber-based compounds, such as butyl rubber, isoprene rubber, nitrile rubber, chloroprene rubber, ethylene-propylene rubber, poly-4-methylpentene-1, polystyrene, polyvinyl butyral, and alkyl denatured compound or copolymers obtained by substituting part of these polymers by an alkyl group. These polymers can be used singly or in the form of a mixture of two or more types of them.

The organic solvent for dissolving the polymer is preferably selected from an aromatic hydrocarbon, a chlorine-containing hydrocarbon, and an aliphatic hydrocarbon, each of which does not essentially dissolve the radiation-sensitive layer. Examples of the aromatic hydrocarbon are toluene, xylene, ethylbenzene, and chlorobenzene. Examples of the chlorine-containing hydrocarbon are methylene chloride, propylene chloride, and ethylene chloride. Examples of the aliphatic hydrocarbon are hexane and cyclohexane. These organic solvents can be used singly or in the form of a mixture of two or more types of them. By using these organic solvents, the coating layer can be dissolved away after pattern exposure and baking and before development.

The coating layer formed in the method according to the second embodiment may contain, as a film-modifying agent, a surfactant similar to those used in the acidic coating layer in the method according to the first embodiment as needed.

For the same reasons as for the acidic coating layer in the method according to the first embodiment, the thickness of the coating layer formed in the method according to the second embodiment is set to between preferably about 10 and 1,000 nm, and more preferably 50 and 500 nm.

In the method according to the second embodiment, it is also possible to accelerate the amplification reaction of an acid generated in the radiation-sensitive layer by baking the radiation-sensitive layer and the coating layer at a temperature of generally about 70° to 160° C., preferably 80° to 150° C. after pattern exposure.

The present invention will be described in more detail below by way of its examples. Note that these examples are described for the sake of easy understanding of the present invention and hence do not particularly limit the present invention.

PREPARATION OF RADIATION-SENSITIVE COMPOSITION

The following compounds (photo-acid generators) capable of generating an acid when exposed to a chemical radiation, compounds (which are decomposed by an acid) having at least one linkage decomposable by an acid, and, if necessary, alkali-soluble polymers were mixed together in the formulations shown in Table 1 and dissolved in organic solvents of the types and amounts listed in Table 1. The resultant solutions were filtered through a cellulose membrane filter with a pore size of 0.2 μm to prepare radiation-sensitive compositions RE-1 to RE-12.

Photo acid-generators (A-1)

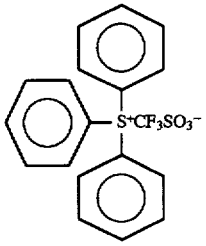

(A-2)

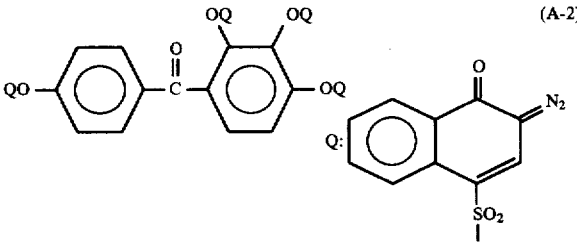

(A-3)

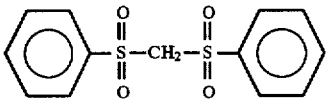

Compounds decomposed by acid (B-1)

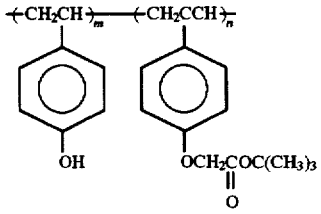

(B-2)

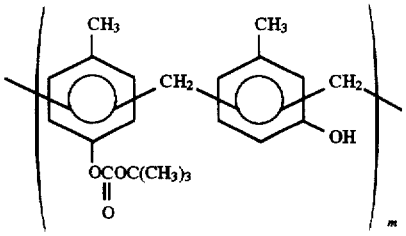

-continued (B-3)

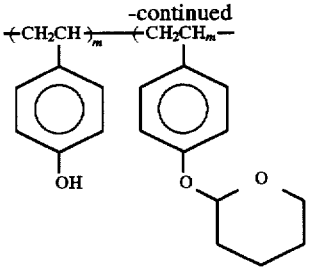

Alkali-soluble polymers (C-1)

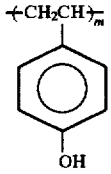

(C-2)

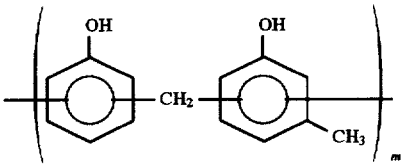

TABLE 1

| Symbol of radiation-sensitive composition | Photo-acid generator (mixing amount) | Compound decomposed by acid (mixing amount) | Alkali-soluble polymer (mixing (amount) | Organic solvent (mixing amount) |
|---|---|---|---|---|
| RE-1 | A-1 (0.2 g) | B-1 (24.8 g) | — | Ethyl cellosolve aceate (75.0 g) |
| RE-2 | A-2 (2.0 g) | B-1 (18.0 g) | C-1 (5.0 g) | Ethyl cellosolve acetate (75.0 g) |
| RE-3 | A-3 (1.8 g) | B-1 (15.2 g) | C-1 (8.0 g) | Ethyl cellosolve acetate (75.0 g) |
| RE-4 | A-2 (1.1 g) | B-2 (14.0 g) | C-2 (6.9 g) | Ethyl lactate (78.0 g) |
| RE-5 | A-1 (1.1 g) | B-1 (20.0 g) | C-1 (4.9 g) | Ethyl cellosolve acetate (75.0 g) |
| RE-6 | A-1 (0.3 g) | B-3 (24.7 g) | — | Ethyl cellosolve acetate (75.0 g) |
| RE-7 | A-1 (0.15 g) | B-1 (24.85 g) | — | Ethyl cellosolve acetate (75.0 g) |
| RE-8 | A-2 (3.5 g) | B-1 (21.5 g) | — | Ethyl cellosolve acetate (75.0 g) |
| RE-9 | A-3 (2.0 g) | B-1 (15.0 g) | C-1 (8.0 g) | Ethyl cellosolve acetate (75.0 g) |
| RE-10 | A-2 (2.0 g) | B-2 (14.0 g) | C-2 (6.0 g) | Ethyl lactate (78.0 g) |
| RE-11 | A-1 (0.2 g) | B-1 (19.8 g) | C-1 (5.0 g) | Ethyl cellosolve acetate (75.0 g) |
| RE-12 | A-1 (0.4 g) | B-3 (24.6 g) | — | Ethyl cellosolve acetate (75.0 g) |

EXAMPLE 1—1

The radiation-sensitive composition RE-1 described in Table 1 was spin-coated on a silicon wafer having a diameter of 6 inches and pre-baked on a hot plate at 90° C. for 90 seconds to form a radiation-sensitive composition layer (resist film) having a thickness of 1.0 μm. 4 g of a methyl vinyl ether-maleic anhydride copolymer were dissolved in 96 g of pure water, and the resultant solution was filtered through a cellulose membrane filter with a pore size of 0.45 μm to prepare an acidic aqueous polymer solution. This aqueous solution was spin-coated on the above resist film and baked on a hot plate at 90° C. for 60 seconds to form a acidic coating layer having a thickness of 0.15 μm.

The resist film covered with the coating layer was pattern-exposed to KrF excimer laser by using a stepper (NA=0.42) and baked on a hot plate at 100° C. for 90 seconds. Subsequently, the resultant wafer was dipped in a 2.38% aqueous solution of tetramethylammoniumhydroxide (to be abbreviated to an aqueous TMAH solution hereinafter) for 30 seconds to develop the resist film. In addition, the wafer was washed with water and dried to form a resist pattern comprising predetermined lines and spaces.

When the obtained resist pattern was observed by a scanning electron microscope (to be abbreviated an SEM hereinafter), a pattern with a line width of 0.30 μm was resolved at an exposure amount of 20 mJ/cm$^2$. The sectional shape of the pattern was a rectangle, and no eaves were found.

Comparative Example 1—1

A resist pattern was formed following the same procedures and conditions as in Example 1—1 except no coating layer was formed on a resist film.

When the obtained resist pattern was observed by an SEM, a pattern with a line width of 0.40 μm was resolved at an exposure amount of 34 mJ/cm$^2$. However, the sectional shape of the pattern was an inverted triangle, and a large number of eaves were produced so that adjacent lines were in contact with each other.

Comparative Example 1—2

A resist pattern was formed following the game procedures and conditions as in Example 1—1 except a coating layer was formed by using an aqueous solution prepared by dissolving polyvinyl alcohol in pure water.

When the obtained resist pattern was observed by an SEM, a pattern with a line width of 0.35 μm was resolved at an exposure amount of 26 mJ/cm$^2$. However, eaves were produced on the surface of the pattern (the surface portions of lines), and it was judged that accurate pattern dimensions would not be maintained in the subsequent etching process using that resist pattern as a mask.

Example 1—2

The radiation-sensitive composition RE-2 described in Table 1 was spin-coated on a silicon wafer having a diameter of 6 inches and pre-baked on a hot plate at 90° C. for 300 seconds to form a radiation-sensitive composition layer (resist film) having a thickness of 1.0 μm. 5 g of polystyrenesulfonic acid were dissolved in 95 g pure water, and the resultant solution was filtered through a cellulose membrane filter with a pore size 0.45 μm to prepare an acidic aqueous polymer solution. This aqueous solution was spin-coated on the above resist film and baked on a hot plate at 90° C. for 60 seconds to form a acidic coating layer having a thickness of 0.15 μm.

The resist film covered with the coating layer was pattern-exposed to KrF excimer laser by a stepper (NA=0.42) and baked on a hot plate at 120° C. for 120 seconds. Subsequently, the resultant wafer was dipped in a 2.38% aqueous TMAH solution or 30 seconds to develop the resist film. In addition, the wafer was washed with water and dried to form a resist pattern.

When the obtained resist pattern was observed by an SEM, a pattern with a line width of 0.30 μm was resolved at an exposure amount of 42 mJ/cm$^2$. The sectional shape of the pattern was a rectangle, and no eaves were found.

EXAMPLE 1-3

A resist pattern was formed following the same procedures and conditions as in Example 1-2 except pattern-exposure to i-line by using a stepper (NA=0.50) was employed and the subsequent baking was performed at 110° C. for 120 seconds.

When the obtained resist pattern was observed by an SEM, a pattern with a line width of 0.35 μm was resolved with an exposure time of 65 msec. The sectional shape of the pattern was a rectangle, and no eaves were found.

EXAMPLE 1-4

The radiation-sensitive composition RE-3 described in Table 1 was spin-coated on a silicon wafer having a diameter of 6 inches and pre-baked on a hot plate at 130° C. for 120 seconds to form a radiation-sensitive composition layer (resist film) having a thickness of 1.0 μm. 4 g of a methyl vinyl ether-maleic anhydride copolymer were dissolved in 96 g of pure water, and the resultant solution was filtered through a cellulose membrane filter with a pore size of 0.45 μm to prepare an acidic aqueous polymer solution. This aqueous solution was spin-coated on the above resist film and baked on a hot plate at 90° C. for 120 seconds to form in acidic coating layer having a thickness of 0.15 μm.

The resist film covered with the coating layer was pattern-exposed to electron beam at an acceleration voltage of 20 keV and baked on a hot plate at 100° C. for 120 seconds. Subsequently, the resultant wafer was dipped in a 2.38% aqueous TMAH solution for 30 seconds to develop the resist film. In addition, the wafer was washed with water and dried to form a resist pattern.

When the obtained resist pattern was observed by an SEM, a pattern with a line width of 0.25 μm was resolved at an electron beam exposure amount of 5 μC/m$^2$. The sectional shape of the pattern was a rectangle, and no eaves were found.

EXAMPLE 1-5

The radiation-sensitive composition RE-4 described in Table 1 was spin-coated on a silicon wafer having a diameter of 6 inches and pre-baked on a hot plate at 90° C. for 300 seconds to form a radiation-sensitive composition layer (resist film) having a thickness of 1.0 μm. 4 g of a methyl vinyl ether-maleic anhydride copolymer were dissolved in 96 g of pure water, and the resultant solution was filtered through a cellulose membrane filter with a pore size of 0.45 μm to prepare an acidic aqueous polymer solution. This aqueous solution was spin-coated on the above resist film and baked on a hot plate at 90° C. for 60 seconds to form a acidic coating layer having a thickness of 0.15 μm.

The resist film covered with the coating layer was pattern-exposed to i-line by using a stepper (NA=0.50) and baked on a hot plate at 120° C. for 120 seconds. Subsequently, the resultant wafer was dipped in a 2.38% aqueous TMAH solution for 30 seconds to develop the resist film. In addition, the wafer was washed with water and dried to form a resist pattern.

When the obtained resist pattern was observed by an SEM, a pattern with a line width of 0.35 μm was resolved with an exposure time of 75 msec. The sectional shape of the pattern was a rectangle, and no eaves were found.

EXAMPLE 1-6

A resist pattern was formed following the same procedures and conditions as in Example 1—1 except RE—5 described in Table 1 was used as a radiation-sensitive composition.

When the obtained resist pattern was observed by an SEM, a pattern with a line width of 0.30 μm was resolved at an exposure amount of 34 mJ/cm$^2$. The sectional shape of the pattern was a rectangle, and no eaves were found.

EXAMPLE 1-7

A resist pattern was formed following the same procedures and conditions as in Example 1—1 except RE—6 described in Table 1 was used as a radiation-sensitive composition and polyacrylic acid was used as a polymer for forming a coating layer.

when the obtained resist pattern was observed by an SEM, a pattern with a line width of 0.30 μm was resolved at an exposure amount of 28 mJ/cm$^2$. The sectional shape of the pattern was a rectangle, and no eaves were found.

EXAMPLE 2-1

The radiation-sensitive composition RE-7 described in Table 1 was spin-coated on a silicon wafer having a diameter of 6 inches and pre-baked on a hot plate at 90° C. for 90 seconds to form a radiation-sensitive composition layer (resist film) having a thickness of 1.0 μm. 3 g of polyvinyl alcohol were dissolved in 97 g of pure water, 0.5 g of sulfosalicylic acid was dissolved in the resultant solution, and the solution was filtered through a cellulose membrane filter with a pore size of 0.22 μm to prepare an acidic aqueous polymer solution. This aqueous solution was spin-coated on the above resist film and baked on a hot plate at 90° C. for 60 seconds to form a acidic coating layer having a thickness of 0.15 μm.

The resist film covered with the coating layer was pattern-exposed to KrF excimer laser by using a stepper (NA=0.45) and baked on a hot plate at 95° C. for 90 seconds. Subsequently, the resultant wafer was dipped in a 1.19% aqueous TMAH solution for 30 seconds to develop the resist film. In addition, the wafer was washed with water and dried to form a resist pattern.

When the obtained resist pattern was observed by an SEM, a pattern with a line width of 0.30 μm was resolved at an exposure amount of 28 mJ/cm$^2$. The sectional shape of the pattern was a rectangle, and no eaves were found.

Comparative Example 2-1

A resist pattern was formed following the same procedures and conditions as in Example 2-1 except no coating layer was formed on a resist film.

When the obtained resist pattern was observed by an SEM, a pattern with a line width of 0.45 μm was resolved at an exposure amount of 42 mJ/cm$^2$. However, the sectional shape of the pattern was an inverted triangle, and a large number of eaves were produced so that adjacent lines were in contact with each other.

Comparative Example 2—2

A resist pattern was formed following the same procedures and conditions as in Example 2-1 except a coating layer was formed by using an aqueous solution prepared by dissolving polyvinyl alcohol in pure water.

When the obtained resist pattern was observed by an SEM, a pattern with a line width of 0.40 μm was resolved at an exposure amount of 40 mJ/cm$^2$. However, eaves were produced on the surface of the pattern (the surface portions of lines), and it was judged that accurate pattern dimensions would not be maintained in the subsequent etching process using that resist pattern as a mask.

EXAMPLE 2—2

The radiation-sensitive composition RE-8 described in Table 1 was spin-coated on a silicon wafer 6 having a diameter of 6 inches and pre-baked on a hot plate at 90° C. for 300 seconds to form a radiation-sensitive composition layer (resist film) having a thickness of 1.0 μm. 3 g of polyvinyl alcohol were dissolved in 97 g of pure water, 0.4 g of p-toluenesulfonic acid was dissolved in the resultant solution, and the solution was filtered through a cellulose membrane filter with a pore size of 0.22 μm to prepare an acidic aqueous polymer solution. This aqueous solution was spin-coated on the above resist film and baked on a hot plate at 90° C. for 60 seconds to form a acidic coating layer having a thickness of 0.15 μm.

The resist film covered with the coating layer was pattern-exposed to KrF excimer laser by using a stepper (NA=0.45) and baked on a hot plate at 115° C. for 120 seconds. Subsequently, the resultant wafer was dipped in a 1.19% aqueous TMAH solution for 30 seconds to develop the resist film. In addition, the wafer was washed with water and dried to form a resist pattern.

When the obtained resist pattern was observed by an SEM, a pattern with a line width of 0.30 μm was resolved at an exposure amount of 45 mJ/cm$^2$. The sectional shape of the pattern was a rectangle, and no eaves were found.

EXAMPLE 2-3

A resist pattern was formed following the same procedures and conditions as in Example 2—2 except pattern-exposure to i-line by using a stepper (NA=0.50) was employed and the subsequent baking was performed at 110° C. for 120 seconds.

When the obtained resist pattern was observed by an SEM, a pattern with a line width of 0.35 μm was resolved with an exposure time of 60 msec. The sectional shape of the pattern was a rectangle, and no eaves were found.

EXAMPLE 3-1

The radiation-sensitive composition RE-9 described in Table 1 was spin-coated on a silicon wafer having a diameter of 6 inches and pre-baked on a hot plate at 130° C. for 120 seconds to form a radiation-sensitive composition layer (resist film) having a thickness of 1.0 μm. 4 g of a methyl vinyl ether-maleic anhydride copolymer were dissolved in 96 g of pure water, 0.1 g of 5-sulfosalicylic acid was dissolved in the resultant solution, and the solution was filtered through a cellulose membrane filter with a pore size of 0.22 μm to prepare an acidic aqueous polymer solution. This aqueous solution was spin-coated on the above resist film and baked on a hot plate at 90° C. for 120 seconds to form a acidic coating layer having a thickness of 0.15 μm.

The resist film covered with the coating layer was pattern-exposed to electron beam at an acceleration voltage of 20 keV and baked on a hot plate at 100° C. for 120 seconds. Subsequently, the resultant wafer was dipped in a 1.19% aqueous TMAH solution for 30 seconds to develop the resist film. In addition, the wafer was washed with water and dried to form a resist pattern. Note that six hours were required from the formation of the coating layer on the resist film to the start of development.

when the obtained resist pattern was observed by an SEM, a pattern with a line width of 0.25 μm was resolved at an electron beam exposure amount of 7 μC/m$^2$. Although the pattern was formed through a long process, the sectional shape of the pattern was a rectangle, and no eaves were found.

EXAMPLE 3-2

The radiation-sensitive composition RE-10 described in Table 1 was spin-coated on a silicon wafer having a diameter of 6 inches and pre-baked on a hot plate at 90° C. for 300 seconds to form a radiation-sensitive composition layer (resist film) having a thickness of 1.0 μm. 4 g of a methyl vinyl ether-maleic anhydrice copolymer were dissolved in 96 g of pure water, 0.12 g of sulfosalicylic acid and 0.05 g of a polyoxyalkyl phenyl ether-based surfactant were dissolved in the resultant solution, and the solution was filtered through a cellulose membrane filter with a pore size of 0.22 μm to prepare an acidic aqueous polymer solution. This aqueous solution was spin-coated on the above resist film and baked on a hot plate at 90° C. for 60 seconds to form a acidic coating layer having a thickness of 0.15 μm.

The resist film covered with the coating layer was pattern-exposed to i-line by using a stepper (NA =0.50) and baked on a hot plate at 120° C. for 120 seconds. Subsequently, the resultant wafer was dipped in a 1.19% aqueous TMAH solution for 30 seconds to develop the resist film. In addition, the wafer was washed with water and dried to form a resist pattern.

When the obtained resist pattern was observed by an SEM, a pattern with a line width of 0.35 μm was resolved with an exposure time of 82 msec. The sectional shape of the pattern was a rectangle, and no eaves were found.

EXAMPLE 3—3

A resist pattern was formed following the same procedures and conditions as in Example 2-1 except RE-11 described in Table 1 was used as a radiation-sensitive composition and the solution prepared in Example 3-2 was used as an acidic aqueous polymer solution.

When the obtained resist pattern was observed by an SEM, a pattern with a line width of 0.30 μm was resolved at an exposure amount of 22 mJ/cm$^2$. The sectional shape of the pattern was a rectangle, and no 25 eaves were found.

EXAMPLE 3-4

The radiation-sensitive composition RE-12 described in Table 1 was spin-coated on a silicon wafer having a diameter of 6 inches and pre-baked on a hot plate at 90° C. for 90 seconds to form a radiation-sensitive composition layer (resist film) having a thickness of 1.0 μm. 5 g of polyacrylic acid were dissolved in 95 g of pure water, 0.15 g of oxalic acid was dissolved in the resultant solution, and the solution was filtered through a cellulose membrane filter with a pore size of 0.22 μm to prepare an acidic aqueous polymer solution. This aqueous solution was spin-coated on the above resist film and baked on a hot plate at 90° C. for 60 seconds to form a acidic coating layer having a thickness of 0.15 μm.

The resist film covered with the coating layer was pattern-exposed to KrF excimer laser by using a stepper (NA=0.45) and baked on a hot plate at 100° C. for 90 seconds. Subsequently, the resultant wafer was dipped in a 1.19% aqueous TMAH solution for 30 seconds to develop the resist film. In addition, the wafer was washed with water and dried to form a resist pattern. When the obtained resist pattern was observed by an SEM, a pattern with a line width of 0.30 μm was resolved at an exposure amount of 36 mJ/cm$^2$. The sectional shape of the pattern was a rectangle, and no eaves were found.

EXAMPLE 4-1

The radiation-sensitive composition RE-1 described in Table 1 was spin-coated on a silicon wafer having a diameter of 6 inches and pre-baked on a hot plate at 90° C. for 90 seconds to form a radiation-sensitive composition layer (resist film) having a thickness of 1.0 μm. 4 g of butyl rubber were dissolved in 96 g of xylene, and the resultant solution was filtered through a fluorine resin membrane filter with a pore size of 0.5 μm to prepare a polymer solution. This solution was spin-coated on the above resist film and baked on a hot plate at 90° C. for 60 seconds to form a coating layer having a thickness of 0.10 μm.

The resist film covered with the coating layer was pattern-exposed to KrF excimer laser by using a stepper (NA=0.42) and baked on a hot plate at 100° C. for 90 second. Subsequently, after the coating layer was dissolved away by xylene, the resultant wafer was dipped in a 2.38% aqueous TMAH solution for 30 seconds to develop the resist film. In addition, the wafer was washed with water and dried to form a resist pattern.

When the obtained resist pattern was observed by an SEM, a pattern with a line width of 0.30 μm was resolved at an exposure amount of 30 mJ/cm$^2$. The sectional shape of the pattern was a rectangle, and no eaves were found.

EXAMPLE 4-2

The radiation-sensitive composition RE-2 described in Table 1 was spin-coated on a silicon wafer having a diameter of 6 inches and pre-baked on a hot plate at 90° C. for 300 seconds to form a radiation-sensitive composition layer (resist film) having a thickness of 1.0 μm. 4 g of butyl rubber were dissolved in 96 g of xylene, and the resultant solution was filtered through a fluorine resin membrane filter with a pore size of 0.5 pm to prepare a polymer solution. This solution was spin-coated on the above resist film and baked on a hot plate at 90° C. for 60 seconds to form a coating layer having a thickness of 0.10 μm.

The resist film covered with the coating layer was pattern-exposed to KrF excimer laser by using a stepper (NA=0.42) and baked on a hot plate at 120° C. for 120 seconds. Subsequently, after the coating layer was dissolved away by xylene, the resultant wafer was dipped in a 2.38% aqueous TMAH solution for 30 seconds to develop the resist film. In addition, the wafer was washed with water and dried to form a resist pattern.

When the obtained resist pattern was observed by an SEM, a pattern with a line width of 0.30 μm was resolved at an exposure amount of 66 mJ/cm$^2$. The sectional shape of the pattern was a rectangle, and no eaves were found.

EXAMPLE 4-3

A resist pattern was formed following the same procedures and conditions as in Example 4-2 except pattern-exposure to i-line by using a stepper (NA=0.50) was employed and the subsequent baking was performed at 110° C. for 120 seconds.

When the obtained resist pattern was observed by an SEM, a pattern with a line width of 0.35 μm was resolved with an exposure time of 75 msec. The sectional shape of the pattern was a rectangle, and no eaves were found.

EXAMPLE 4—4

The radiation-sensitive composition RE-3 described in Table 1 was spin-coated on a silicon wafer having a diameter of 6 inches and pre-baked on a hot plate at 130° C. for 120 seconds to form a radiation-sensitive composition layer (resist film) having a thickness of 1.0 μm 6 g of poly-4-methylpentene-1 were dissolved in 94 g of xylene, and the resultant solution was filtered through a fluorine resin membrane filter with a pore size of 0.5 fm to prepare a polymer solution. This solution was spin-coated on the above resist film and baked on a hot plate at 90° C. for 60 seconds to form a coating layer having a thickness of 0.12 μm.

The resist film covered with the coating layer was pattern-exposed to electron beam at an acceleration voltage of 20 keV and baked on a hot plate at 100° C. for 120 seconds. Subsequently, after the coating layer was dissolved away by xylene, the resultant wafer was dipped in a 2.38% aqueous TMAH solution for 30 seconds to develop the resist film. In addition, the wafer was washed with water and dried to form a resist pattern.

When the obtained resist pattern was observed by an SEM, a pattern with a line width of 0 25 μm was resolved at an electron beam exposure amount of 7 $\mu C/m^2$. The sectional shape of the pattern was a rectangle, and no eaves were found.

EXAMPLE 4-5

The radiation-sensitive composition RE-4 described in Table 1 was spin-coated on a silicon wafer having a diameter of 6 inches and pre-baked on a hot plate at 90° C. for 300 seconds to form a radiation-sensitive composition layer (resist film) having a thickness of 1.0 μm. 6 g of poly-4-methylpentene-1 were dissolved in 94 g of xylene, and the resultant solution was filtered through a fluorine resin membrane filter with a pore size of 0.5 μm to prepare a polymer solution. This solution was spin-coated on the above resist film and baked on a hot plate at 90° C. for 60 seconds to form a coating layer having a thickness of 0.12 μm.

The resist film covered with the coating layer was pattern-exposed to i-line by using a stepper (NA =0.50) and baked on a hot plate at 120° C. for 120 seconds. Subsequently, after the coating layer was dissolved away by xylene, the resultant wafer was dipped in a 2.38% aqueous TMAH solution for 30 seconds to develop the resist film. In addition, the wafer was washed with water and dried to form a resist pattern.

When the obtained resist pattern was observed by an SEM, a pattern with a line width of 0.35 μm was resolved with an exposure time of 80 msec. The sectional shape of the pattern was a rectangle, and no eaves were found.

EXAMPLE 4-6

A resist pattern was formed following the same procedures and conditions as in Example 4-1 except RE-5 described in Table 1 was used as a radiation-sensitive composition.

When the obtained resist pattern was observed by an SEM, a pattern with a line width of 0.30 μm was resolved at an exposure amount of 36 $mJ/cm^2$. The sectional shape of the pattern was a rectangle, and no eaves were found.

EXAMPLE 4-7

A resist pattern was formed following the same procedures and conditions as in Example 4-1 except RE-6 described in Table 1 was used as a radiation-sensitive composition and polypropylene was used as a polymer for forming a coating layer.

When the obtained resist pattern was observed by an SEM, a pattern with a line width of 0.30 μm was resolved at an exposure amount of 32 $mJ/cm^2$. The sectional shape of the pattern was a rectangle, and no eaves were found.

According to the present invention as has been described in detail above, the chemical amplification-type resist is used to perform the process of, e.g., pattern-exposure to a radiation with a short wavelength, such as ultraviolet rays or ionizing radiation, baking, and development. Hence, it is possible to form a pattern with a high resolution and a rectangular sectional shape without producing eaves on surface of the resist film, which is caused by a surface inhibition layer.

In addition, the use of this pattern as a mask makes etching with a high processing precision feasible. The present invention, therefore, can be effectively applied to the process of micropatterning in the fabrication of semiconductor devices such as LSIs, so the invention is of a large industrial value.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

[1. A pattern forming method comprising the steps of:

forming, on a substrate, a radiation-sensitive layer comprising as a main component a radiation-sensitive composition containing a compound capable of generating an acid when exposed to a chemical radiation and a compound having at least one linkage decomposable by an acid;

forming an acidic coating layer on the radiation-sensitive layer;

pattern-exposing the radiation-sensitive layer and the acidic coating layer to a chemical radiation; and developing the radiation-sensitive layer and the acidic coating layer by removing exposed parts of the layers after the pattern exposing step.]

[2. The method according to claim 1, wherein the compound capable of generating an acid when exposed to a chemical radiation is triphenylsulfonium trifluoromethanesulfonate.]

[3. The method according to claim 1, wherein the compound having at least one linkage decomposable by an acid is a copolymer of 4-tert-butoxycarbonylmethoxystylene and 4-vinylphenol.]

[4. The method according to claim 1, wherein an amount of the compound capable of generating an acid when exposed to a chemical radiation in the radiation-sensitive composition is about 0.1 to 30 wt % based on the weight of the solid components of the composition.]

[5. The method according to claim 1, wherein the radiation-sensitive composition further contains an alkali-soluble polymer.]

[6. The method according to claim 5, wherein a mixing amount of the alkali-soluble polymer in the radiation-sensitive composition is not more than about 90 parts by weight with respect to a total of 100 parts by weight of the compound having at least one linkage decomposable by an acid, and the alkali-soluble polymer.]

[7. The method according to claim 1, wherein the acidic coating layer comprises in acidic water-soluble polymer.]

[8. The method according to claim 7, wherein the acidic water-soluble polymer is a methyl vinyl ether-maleic anhydride copolymer.]

[9. The method according to claim 1, wherein the acidic coating layer comprises an organic acid and a water-soluble polymer.]

[10. The method according to claim 9, wherein the organic acid is sulfosalicylic acid, and the watersoluble polymer is polyvinyl alcohol.]

[11. The method according to claim 1, wherein the acidic coating layer comprises an organic acid and an acidic water-soluble polymer.]

[12. The method according to claim 11, wherein the organic acid is sulfosalicylic acid, and the acidic water-soluble polymer is a methyl vinyl ether-maleic anhydride copolymer.]

[13. The method according to claim 1, wherein the acidic coating layer further contains a surfactant.]

[14. The method according to claim 1, wherein the thickness of the entire acidic coating layer is between about 10 and 1,000 nm.]

[15. The method according to claim 1, wherein the radiation-sensitive layer and the acidic coating layer are baked between the pattern-exposing step and the developing step.]

[16. The method according to claim 1, wherein an aqueous alkaline solution is used as a developing solution in the development.]

17. A pattern forming method comprising the steps of:

forming, on a substrate, a radiation-sensitive layer comprising as a main component a radiationsensitive composition containing triphenylsulfonium trifluoromethanesulfonate and a copolymer of 4-tert-butoxycarbonylmethexystylene;

forming a coating layer comprising a methyl vinyl ether-maleic anhydride copolymer on the radiation-sensitive layer;

pattern-exposing the radiation-sensitive layer and the acidic coating layer to KrF excimer laser; and developing the radiation-sensitive layer and the acidic coating layer by using an aqueous alkaline solution after exposure.

[18. A pattern forming method comprising the steps of: (a) forming, on a substrate, a radiation-sensitive layer comprising as a main component a radiation-sensitive composition containing a compound capable of generating an acid when exposed to a chemical radiation and a compound having at least one linkage decomposable by an acid; (b) pattern-exposing the radiation-sensitive layer to a chemical radiation; and (c) developing the radiation-sensitive layer after exposure to obtain the pattern, in which an acidic coating layer is formed on the radiation-sensitive layer immediately after the step (a), followed by conducting the step (b) so as to shield the radiation-sensitive layer against contaminations in the process atmosphere and thereby prevent formation of a surface inhibition layer on the surface of the radiation-sensitive layer.]

*19. A pattern forming method comprising the steps of:*

*forming, on a substrate, a radiation-sensitive layer comprising as a main component a radiation-sensitive composition containing a compound capable of generating an acid when exposed to a chemical radiation and a copolymer of 4-tert-butoxycarbonylmethoxystyrene and 4-vinylphenol;*

*forming an acidic coating layer on the radiation-sensitive layer;*

*pattern-exposing the radiation-sensitive layer and the acidic coating layer to a chemical radiation; and*

*developing the radiation-sensitive layer and the acidic coating layer by removing exposed parts of the layers after the pattern exposing step.*

*20. A pattern forming method comprising the steps of:*

*forming, on a substrate, a radiation-sensitive layer comprising as a main component a radiation-sensitive composition containing a compound capable of generating an acid when exposed to a chemical radiation and a compound having at least one linkage decomposable by an acid;*

*forming an acidic coating layer comprising a methyl vinyl ether-maleic anhydride copolymer on the radiation-sensitive layer;*

*pattern-exposing the radiation-sensitive layer and the acidic coating layer to a chemical radiation; and*

*developing the radiation-sensitive layer and acidic coating layer by removing exposed parts of the layers after the pattern exposing step.*

*21. A pattern forming method comprising the steps of:*

*forming, on a substrate, a radiation-sensitive layer comprising as a main component a radiation-sensitive composition containing a compound capable of generating an acid when exposed to a chemical radiation and a compound having at least one linkage decomposable by an acid;*

*forming an acidic coating layer comprising sulfosalicylic acid and polyvinyl alcohol on the radiation-sensitive layer;*

*pattern-exposing the radiation-sensitive layer and the acidic coating layer to a chemical radiation; and*

*developing the radiation-sensitive layer and the acidic coating layer by removing exposed parts of the layers after the pattern exposing step.*

*22. A pattern forming method comprising the steps of:*

*forming, on a substrate, a radiation-sensitive layer comprising as a main component a radiation-sensitive composition containing a compound capable of generating an acid when exposed to a chemical radiation and a compound having at least one linkage decomposable by an acid;*

*forming an acid coating layer comprising sulfosalicylic acid and a methyl vinyl ether-maleic anhydride copolymer on the radiation-sensitive layer;*

*pattern-exposing the radiation-sensitive layer and the acidic coating layer to a chemical radiation; and*

*developing the radiation-sensitive layer and the acidic coating layer by removing exposed parts of the layers after the pattern exposing step.*

*23. A pattern forming method comprising the steps of:*

*forming, on a substrate, a radiation-sensitive layer comprising as a main component a radiation-sensitive composition containing a compound capable of generating an acid when exposed to a chemical radiation and a compound having at least one linkage decomposable by an acid;*

*forming an acid coating layer containing a surfactant on the radiation-sensitive layer;*

*pattern-exposing the radiation-sensitive layer and the acidic coating layer to a chemical radiation; and*

*developing the radiation-sensitive layer and the acidic coating layer by removing exposed parts of the layers after the pattern exposing step.*

* * * * *